(12) United States Patent
Liu et al.

(10) Patent No.: US 10,345,362 B2
(45) Date of Patent: Jul. 9, 2019

(54) METHOD FOR DETECTING GRID CONNECTION STABILITY OF INVERTER AND INVERTER

(71) Applicant: Huawei Technologies Co., Ltd., Shenzhen (CN)

(72) Inventors: Fangcheng Liu, Shanghai (CN); Kai Xin, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 42 days.

(21) Appl. No.: 15/855,396

(22) Filed: Dec. 27, 2017

(65) Prior Publication Data

US 2018/0120368 A1 May 3, 2018

Related U.S. Application Data

(63) Continuation of application No. PCT/CN2016/084340, filed on Jun. 1, 2016.

(30) Foreign Application Priority Data

Jun. 28, 2015 (CN) .......................... 2015 1 0367063

(51) Int. Cl.
*G01R 27/16* (2006.01)
*G01R 27/26* (2006.01)
(Continued)

(52) U.S. Cl.
CPC ........... *G01R 31/086* (2013.01); *G01R 27/16* (2013.01); *G01R 27/26* (2013.01); *G01R 31/44* (2013.01);
(Continued)

(58) Field of Classification Search
CPC ................. G01R 31/086; G01R 27/16; H02M 200/0009
(Continued)

(56) References Cited

U.S. PATENT DOCUMENTS

2009/0230980 A1 9/2009 Williams
2011/0182093 A1 7/2011 Brogan et al.
(Continued)

FOREIGN PATENT DOCUMENTS

CN 102142690 A 8/2011
CN 102914697 A 2/2013
(Continued)

OTHER PUBLICATIONS

Device and method for harmonic impedance measurement of microgrid; Date: Nov. 11, 2013; Chinese: CN 103630748A; (Year: 2013).*

(Continued)

*Primary Examiner* — Dharti H Patel
(74) *Attorney, Agent, or Firm* — Slater Matsil, LLP

(57) ABSTRACT

The present disclosure relates to the field of inverters, and to a method for detecting grid connection stability of an inverter and an inverter. The method includes: detecting a line voltage and a current of the alternating current port to obtain a first group of line voltage values and a first group of current values; detecting the line voltage and the current of the alternating current port to obtain a second group of line voltage values and a second group of current values; obtaining an equivalent impedance matrix of the power grid according to the first group of line voltage values, the first group of current values, the second group of line voltage values, and the second group of current values; and determining, by the inverter according to an equivalent admittance matrix and the equivalent impedance matrix, whether a stability requirement of the inverter is met.

20 Claims, 5 Drawing Sheets

(51) Int. Cl.
| | |
|---|---|
| *G01R 31/08* | (2006.01) |
| *G01R 31/44* | (2006.01) |
| *H02M 7/42* | (2006.01) |
| *H02M 1/00* | (2006.01) |
| *H02H 1/00* | (2006.01) |
| *H02J 3/38* | (2006.01) |
| *H02H 7/122* | (2006.01) |
| *H02M 1/084* | (2006.01) |
| *H02M 7/5387* | (2007.01) |

(52) U.S. Cl.
CPC ........ *H02H 1/0007* (2013.01); *H02H 1/0092* (2013.01); *H02H 7/1227* (2013.01); *H02J 3/38* (2013.01); *H02M 1/084* (2013.01); *H02M 7/42* (2013.01); *H02M 7/53875* (2013.01); *H02M 2001/0009* (2013.01)

(58) Field of Classification Search
USPC .............................................. 361/18, 86–87
See application file for complete search history.

(56) References Cited

U.S. PATENT DOCUMENTS

| | | |
|---|---|---|
| 2013/0099800 A1 | 4/2013 | Francis et al. |
| 2014/0032148 A1 | 1/2014 | Verhulst et al. |

FOREIGN PATENT DOCUMENTS

| | | |
|---|---|---|
| CN | 103354359 A | 10/2013 |
| CN | 103545838 A | 1/2014 |
| CN | 103595065 A | 2/2014 |
| CN | 103630748 A | 3/2014 |
| CN | 103630749 A | 3/2014 |
| CN | 104638678 A | 5/2015 |
| JP | 2013116019 A | 6/2013 |
| JP | 5770610 B2 | 8/2015 |

OTHER PUBLICATIONS

Cespedes, M. et al., "Adaptive Control of Grid-Connected Inverters Based on Online Grid Impedance Measurements," IEEE Transactions on Sustainable Energy, vol. 5, No. 2, Apr. 2014, pp. 516-523.
Familiant, Y.L. et aL, "Ac Impedance Measurement Techniques," IEEE International Conference on Electric Machines and Drives, May 15, 2005, pp. 1850-1857.
Roinila, T. et al., "Online Grid Impedance Measurement Using Discrete-Interval Binary Sequence Injection," IEEE Journal of Emerging and Selected Topics in Power Electronics, vol. 2, No. 4, Dec. 2014, pp. 985-993.
Sun, J., "Impedance-Based Stability Criterion for Grid-Connected Inverters," IEEE Transactions on Power Electronics, vol. 26, No. 11, Nov. 2011, pp. 3075-3078.
Roinila, T. et al., "Online Grid Impedance Measurement Using Discrete-Interval Binary Sequence Injection," 14th 4nnual Workshop on Control and Modeling for Power Electronics (COMPEL), Jun. 23, 2013, 8 pages.
Knop A. et al., "High Frequency Grid Impedance Analysis by Current Injection," 35th Annual Conference of IEEE Industrial Electronics (IECON), Nov. 3-5, 2009, pp. 536-541.

* cited by examiner

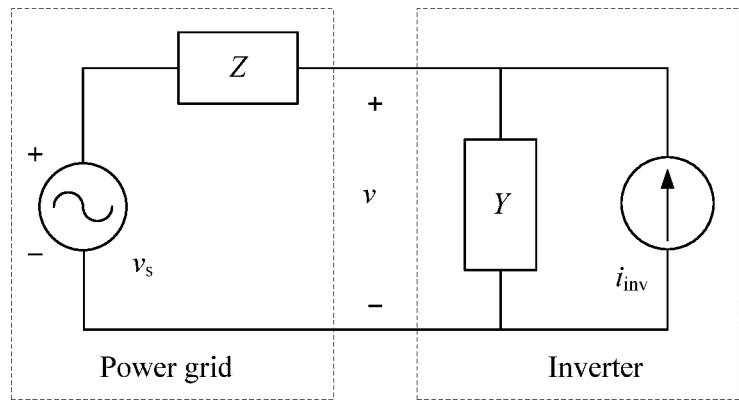

FIG. 1

| An inverter injects a first-sequence disturbance current into a power grid by using an alternating current port of the inverter, and while the first-sequence disturbance current is injected into the power grid, detects a line voltage and a current of the alternating current port to obtain a first group of line voltage values and a first group of current values | 101 |
|---|---|

| The inverter injects a second-sequence disturbance current into the power grid by using the alternating current port of the inverter, and while the second-sequence disturbance current is injected into the power grid, detects the line voltage and the current of the alternating current port to obtain a second group of line voltage values and a second group of current values | 102 |

| The inverter obtains an equivalent impedance matrix of the power grid according to the first group of line voltage values, the first group of current values, the second group of line voltage values, and the second group of current values | 103 |

| The inverter determines, according to an equivalent admittance matrix of the inverter and the equivalent impedance matrix of the power grid, whether a stability requirement of the inverter is met | 104 |

FIG. 2

METHOD FOR DETECTING GRID CONNECTION STABILITY OF INVERTER AND INVERTER

CROSS-REFERENCE TO RELATED APPLICATIONS

This application is a continuation of International Application No. PCT/CN2016/084340, filed on Jun. 1, 2016, which claims priority to Chinese Patent Application No. 201510367063.5, filed on Jun. 28, 2015. The disclosures of the aforementioned applications are hereby incorporated by reference in their entireties.

TECHNICAL FIELD

The present disclosure relates to the field of inverters and to a method for detecting grid connection stability of an inverter and an inverter.

BACKGROUND

An inverter is relatively common in a modernized power system. A direct current port of the inverter is connected to an external direct current power supply, and an alternating current port of the inverter is connected to an alternating current power grid. A main function of the inverter is to convert direct current electric energy to feed alternating current electric energy that has a constant voltage and a constant frequency and feed the alternating current electric energy to a power grid.

In an operating process, an operating status of the inverter is affected by an actual condition of the power grid. When the inverter is connected to the power grid using a long-distance electricity transmission line, equivalent impedance of the power grid cannot be ignored. The equivalent impedance of the power grid affects voltage stability of an alternating current port of the inverter, and further affects the operating status of the inverter. When the equivalent impedance of the power grid seriously affects the inverter, the inverter cannot operate stably. A typical unstable phenomenon is voltage or current oscillation, and a more serious phenomenon includes shutdown of an inverter or a power supply system caused by triggering protection.

Therefore, before the inverter enables a power transfer mode, impact of the power grid on the inverter needs to be analyzed. The power transfer mode refers to that the inverter converts direct current electric energy to alternating current electric energy that has a constant voltage and a constant frequency and feeds the alternating current electric energy to the power grid. There is a common test method that can be used to test the impact of the power grid on the inverter. Before the inverter enters the power transfer mode, a measurement apparatus injects a disturbance current into a measured system, and calculates a ratio of a voltage to a current of a port of a measured module to obtain a needed equivalent impedance matrix Z of the power grid. After obtaining data of the equivalent impedance matrix Z of the power grid, and of an equivalent admittance matrix Y of an inverter port, a product of Z and Y may be calculated. According to a stability criterion of generalized Nyquist, when and only when a quantity of times that an eigenvalue trace of the product of Z and Y bypasses a point (−1, 0) counterclockwise in a complex plane equals a quantity of right half plane poles of the product of Z and Y, the power grid has relatively little impact on the inverter, and the inverter can operate stably.

However, in an actual measurement process, a power level of the measurement apparatus needs to match a power level of the measured module. Therefore, hardware costs of the entire system are increased. Common measurement apparatuses include a switched capacitor resistor network, an inverter, a synchronous motor, a linear power amplifier circuit, a network analyzer, and the like. When a connection point between the inverter and the power grid is relatively remote, using the measurement apparatus may significantly increase transportation and maintenance costs. When the connection point between the inverter and the power grid is varied, a position of the measurement apparatus also needs to be changed accordingly. In this case, extra transportation costs are generated. In addition, each of transportation, installation, and operation of the measurement apparatus consumes a specific time, thereby affecting operation efficiency of the entire power grid.

It may be learned from the foregoing that, before an inverter performs power transfer, analyzing impact of a power grid on the inverter is quite necessary. However, currently, there is no exact method for determining impact of the power grid on inverter stability when measurement costs are reduced.

SUMMARY

Embodiments of the present disclosure provide a method for detecting grid connection stability of an inverter and an inverter, so as to determine impact of a power grid on inverter stability when no extra measurement apparatus or calculation apparatus is used.

A first aspect of the present disclosure discloses a method for detecting grid connection stability of an inverter. A direct current port of the inverter is connected to an external direct current power supply, and an alternating current port of the inverter is connected to a power grid. The method includes injecting, by the inverter, a first-sequence disturbance current into the power grid by using the alternating current port of the inverter, and while the first-sequence disturbance current is injected into the power grid, detecting a line voltage and a current of the alternating current port to obtain a first group of line voltage values ($v_{ab}^1$, $v_{bc}^1$, and $v_{ca}^1$) and a first group of current values ($i_a^1$, $i_b^1$, and $i_c^1$). The method also includes injecting, by the inverter, a second-sequence disturbance current into the power grid by using the alternating current port of the inverter, and while the second-sequence disturbance current is injected into the power grid, detecting the line voltage and the current of the alternating current port to obtain a second group of line voltage values ($v_{ab}^2$, $v_{bc}^2$, and $v_{ca}^2$) and a second group of current values ($i_a^2$, $i_b^2$, and $i_c^2$). The first-sequence disturbance current is different from the second-sequence disturbance current. The method also includes obtaining, by the inverter, an equivalent impedance matrix of the power grid according to the first group of line voltage values, the first group of current values, the second group of line voltage values, and the second group of current values. The method also includes determining, by the inverter according to an equivalent admittance matrix of the inverter and the equivalent impedance matrix of the power grid, whether a stability requirement of the inverter is met.

According to the first aspect of the present disclosure, in a first possible implementation manner of the first aspect of the present disclosure, before the injecting, by the inverter, a first-sequence disturbance current into the power grid by using the alternating current port of the inverter, the method further includes: detecting, by the inverter, the line voltage of the alternating current port of the inverter to obtain a third group of line voltage values. The method also includes, when an amplitude of any value of the third group of line voltage values is less than a first threshold or a difference between any two amplitudes of the third group of line voltage values is less than a first threshold, starting to inject, by the inverter, the first-sequence disturbance current into the power grid by using the alternating current port of the inverter.

According to the first possible implementation manner of the first aspect of the present disclosure, in a second possible implementation manner of the first aspect of the present disclosure, after the starting to inject, by the inverter, the first-sequence disturbance current into the power grid by using the alternating current port of the inverter, the method further includes: detecting, by the inverter, the current of the alternating current port of the inverter to obtain a third group of current values. The method also includes, when an amplitude of any value of the third group of current values is greater than a second threshold, stopping injecting, by the inverter, the first-sequence disturbance current into the power grid.

According to the first aspect or the first possible implementation manner of the first aspect or the second possible implementation manner of the first aspect of the present disclosure, in a third possible implementation manner of the first aspect of the present disclosure, before the injecting, by the inverter, a second-sequence disturbance current into the power grid by using the alternating current port of the inverter, the method further includes: detecting, by the inverter, the line voltage of the alternating current port of the inverter to obtain a fourth group of line voltage values. The method also includes, when an amplitude of any value of the fourth group of line voltage values is less than a third threshold or a difference between any two amplitudes of the fourth group of line voltage values is less than a third threshold, starting to inject, by the inverter, the second-sequence disturbance current into the power grid by using the alternating current port of the inverter.

According to the third possible implementation manner of the first aspect of the present disclosure, in a fourth possible implementation manner of the first aspect of the present disclosure, after the starting to inject, by the inverter, the second-sequence disturbance current into the power grid by using the alternating current port of the inverter, the method further includes: detecting, by the inverter, the current of the alternating current port of the inverter to obtain a fourth group of current values. The method also includes, when an amplitude of any value of the fourth group of current values is greater than a fourth threshold, stopping injecting, by the inverter, the second-sequence disturbance current into the power grid.

According to the first aspect or the first possible implementation manner of the first aspect or the second possible implementation manner of the first aspect or the third possible implementation manner of the first aspect or the fourth possible implementation manner of the first aspect of the present disclosure, in a fifth possible implementation manner of the first aspect of the present disclosure, the obtaining, by the inverter, an equivalent impedance matrix of the power grid according to the first group of line voltage values, the first group of current values, the second group of line voltage values, and the second group of current values includes: performing coordinate transformation and discrete Fourier transform on the first group of line voltage values $(v_{ab}^1, v_{bc}^1,$ and $v_{ca}^1)$ to obtain a first group of frequency-domain components $(v_d^1(j\omega)$ and $v_q^1(j\omega))$ of a voltage in a synchronous rotating coordinate system; performing coordinate transformation and discrete Fourier transform on the first group of current values $(i_a^1, i_b^1,$ and $i_c^1)$ to obtain a first group of frequency-domain components $(i_d^1(j\omega)$ and $i_q^1(j\omega))$ of a current in the synchronous rotating coordinate system; performing coordinate transformation and discrete Fourier transform on the second group of line voltage values $(v_{ab}^2, v_{bc}^2,$ and $v_{ca}^2)$ to obtain a second group of frequency-domain components $(v_d^2(j\omega)$ and $v_q^2(j\omega))$ of the voltage in the synchronous rotating coordinate system; performing coordinate transformation and discrete Fourier transform on the second group of current values $(i_a^2, i_b^2,$ and $i_c^2)$ to obtain a second group of frequency-domain components $(i_d^2(j\omega)$ and $i_q^2(j\omega))$ of the current in the synchronous rotating coordinate system; and calculating the equivalent impedance matrix $Zdq(j\omega)$ of the power grid in the synchronous rotating coordinate system according to the first group of frequency-domain components of the voltage, the first group of frequency-domain components of the current, the second group of frequency-domain components of the voltage, the second group of frequency-domain components of the current, and the following formula:

$$Z_{dq}(j\omega) = \begin{vmatrix} v_d^1(j\omega) & v_d^2(j\omega) \\ v_q^1(j\omega) & v_q^2(j\omega) \end{vmatrix} \cdot \begin{vmatrix} i_d^1(j\omega) & i_d^2(j\omega) \\ i_q^1(j\omega) & i_q^2(j\omega) \end{vmatrix}^{-1};$$

and the determining, by the inverter according to an equivalent admittance matrix of the inverter and the equivalent impedance matrix of the power grid, whether a stability requirement of the inverter is met includes: multiplying a matrix norm of $Zdq(j\omega)$ by a matrix norm of the equivalent admittance matrix $Ydq(j\omega)$ of the inverter to obtain a product, where $Ydq(j\omega)$ is a parameter pre-stored in the inverter; determining a relationship between the product and a preset value; and when the product is less than the preset value, determining that the inverter is capable of a stable grid-connected operation; or when the product is not less than the preset value, determining that the inverter is not capable of a stable grid-connected operation.

According to the first aspect or the first possible implementation manner of the first aspect or the second possible implementation manner of the first aspect or the third possible implementation manner of the first aspect or the fourth possible implementation manner of the first aspect or the fifth possible implementation manner of the first aspect of the present disclosure, in a sixth possible implementation manner of the first aspect of the present disclosure, the method further includes: when that the inverter is not capable of a stable grid-connected operation is determined, shutting down and sending, by the inverter, an alarm prompt to a monitoring system.

According to the first aspect or the first possible implementation manner of the first aspect or the second possible implementation manner of the first aspect or the third possible implementation manner of the first aspect or the fourth possible implementation manner of the first aspect or the fifth possible implementation manner of the first aspect or the sixth possible implementation manner of the first aspect of the present disclosure, in a seventh possible implementation manner of the first aspect of the present disclosure, the method further includes, when that the inverter is capable of a stable grid-connected operation is determined, ending, by the inverter, a self test process, and entering a power transfer working mode.

A second aspect of the present disclosure discloses an inverter. A direct current port of the inverter is connected to an external direct current power supply, an alternating current port of the inverter is connected to a power grid, and the inverter includes a main circuit, a detection circuit, and a control circuit. The main circuit is configured to inject a first-sequence disturbance current into the power grid by using the alternating current port of the inverter. The detection circuit is configured to, while the main circuit injects the first-sequence disturbance current into the power grid, detect a line voltage and a current of the alternating current port to obtain a first group of line voltage values ($v_{ab}^1$, $v_{bc}^1$, and $v_{ca}^1$) and a first group of current values ($i_a^1$, $i_b^1$, and $i_c^1$). The main circuit is further configured to inject a second-sequence disturbance current into the power grid by using the alternating current port of the inverter. The detection circuit is further configured to, while the main circuit injects the second-sequence disturbance current into the power grid, detect the line voltage and the current of the alternating current port to obtain a second group of line voltage values ($v_{ab}^2$, $v_{bc}^2$, and $v_{ca}^2$) and a second group of current values ($i_a^2$, $i_b^2$, and $i_c^2$). The first-sequence disturbance current is different from the second-sequence disturbance current. The control circuit is configured to obtain an equivalent impedance matrix of the power grid according to the first group of line voltage values, the first group of current values, the second group of line voltage values, and the second group of current values. The control circuit is further configured to determine, according to an equivalent admittance matrix of the inverter and the equivalent impedance matrix of the power grid, whether a stability requirement of the inverter is met.

According to the second aspect of the present disclosure, in a first possible implementation manner of the second aspect of the present disclosure, the detection circuit is further configured to detect the line voltage and the current of the alternating current port of the inverter to obtain a third group of line voltage values; and the control circuit is configured to: when an amplitude of any value of the third group of line voltage values is less than a first threshold or a difference between any two amplitudes of the third group of line voltage values is less than a first threshold, control the main circuit to start to inject the first-sequence disturbance current into the power grid by using the alternating current port of the inverter.

According to the first possible implementation manner of the second aspect of the present disclosure, in a second possible implementation manner of the second aspect of the present disclosure, the detection circuit is further configured to detect the current of the alternating current port of the inverter to obtain a third group of current values. The control circuit is further configured to: when an amplitude of any value of the third group of current values is greater than a second threshold, control the main circuit to stop injecting the first-sequence disturbance current into the power grid.

According to the second aspect or the first possible implementation manner of the second aspect or the second possible implementation manner of the second aspect of the present disclosure, in a third possible implementation manner of the second aspect of the present disclosure, the detection circuit is further configured to detect the line voltage of the alternating current port of the inverter to obtain a fourth group of line voltage values. The control circuit is further configured to: when an amplitude of any value of the fourth group of line voltage values is less than a third threshold or a difference between any two amplitudes of the fourth group of line voltage values is less than a third threshold, control the main circuit to start to inject the second-sequence disturbance current into the power grid using the alternating current port of the inverter.

According to the third possible implementation manner of the second aspect of the present disclosure, in a fourth possible implementation manner of the second aspect of the present disclosure, the detection circuit is further configured to detect the current of the alternating current port of the inverter to obtain a fourth group of current values. The control circuit is further configured to: when an amplitude of any value of the fourth group of current values is greater than a fourth threshold, control the main circuit to stop injecting the second-sequence disturbance current into the power grid.

According to the second aspect or the first possible implementation manner of the second aspect or the second possible implementation manner of the second aspect or the third possible implementation manner of the second aspect or the fourth possible implementation manner of the second aspect of the present disclosure, in a fifth possible implementation manner of the second aspect of the present disclosure, the control circuit is configured to perform coordinate transformation and discrete Fourier transform on the first group of line voltage values ($v_{ab}^1$, $v_{bc}^1$, and $v_{ca}^1$) to obtain a first group of frequency-domain components ($v_d^1(j\omega)$ and $v_q^1(j\omega)$) of a voltage in a synchronous rotating coordinate system. The control circuit is configured to perform coordinate transformation and discrete Fourier transform on the first group of current values ($i_a^1$, $i_b^1$, and $i_c^1$) to obtain a first group of frequency-domain components ($i_d^1(j\omega)$ and $i_q^1(j\omega)$) of a current in the synchronous rotating coordinate system; the control circuit is configured to perform coordinate transformation and discrete Fourier transform on the second group of line voltage values ($v_{ab}^2$, $v_{bc}^2$, and $v_{ca}^2$) to obtain a second group of frequency-domain components ($v_d^2(j\omega)$ and $v_q^2(j\omega)$) of the voltage in the synchronous rotating coordinate system. The control circuit is configured to perform coordinate transformation and discrete Fourier transform on the second group of current values ($i_a^2$, $i_b^2$, and $i_c^2$) to obtain a second group of frequency-domain components ($i_d^2(j\omega)$ and $i_q^2(j\omega)$) of the current in the synchronous rotating coordinate system; the control circuit is configured to calculate the equivalent impedance matrix $Zdq(j\omega)$ of the power grid in the synchronous rotating coordinate system according to the first group of frequency-domain components of the voltage, the first group of frequency-domain components of the current, the second group of frequency-domain components of the voltage, the second group of frequency-domain components of the current, and the following formula:

$$Z_{dq}(j\omega) = \begin{vmatrix} v_d^1(j\omega) & v_d^2(j\omega) \\ v_q^1(j\omega) & v_q^2(j\omega) \end{vmatrix} \cdot \begin{vmatrix} i_d^1(j\omega) & i_d^2(j\omega) \\ i_q^1(j\omega) & i_q^2(j\omega) \end{vmatrix}^{-1}.$$

The control circuit is configured to multiply a matrix norm of $Zdq(j\omega)$ by a matrix norm of the equivalent admittance matrix $Ydq(j\omega)$ of the inverter to obtain a product, where $Ydq(j\omega)$ is a parameter pre-stored in the inverter; the control circuit is configured to determine a relationship between the product and a preset value. The control circuit is configured to: when the product is less than the preset value, determine that the inverter is capable of a stable grid-connected operation. The control circuit is further configured to, when the product is not less than the preset value, determine that the inverter is not capable of a stable grid-connected operation.

According to the second aspect or the first possible implementation manner of the second aspect or the second possible implementation manner of the second aspect or the third possible implementation manner of the second aspect or the fourth possible implementation manner of the second aspect or the fifth possible implementation manner of the second aspect of the present disclosure, in a sixth possible implementation manner of the second aspect, the control circuit is further configured to: when that the inverter is not capable of a stable grid-connected operation is determined, control the inverter to shut down and to send an alarm prompt to a monitoring system.

According to the second aspect or the first possible implementation manner of the second aspect or the second possible implementation manner of the second aspect or the third possible implementation manner of the second aspect or the fourth possible implementation manner of the second aspect or the fifth possible implementation manner of the second aspect or the sixth possible implementation manner of the second aspect of the present disclosure, in a seventh possible implementation manner of the second aspect, the control circuit is further configured to: when that the inverter is capable of a stable grid-connected operation is determined, end a self test process, and control the inverter to enter a power transfer working mode.

It may be learned from the foregoing that by means of the method for detecting grid connection stability of an inverter provided in the present disclosure, when no extra measurement apparatus or calculation apparatus is used, grid connection stability can be detected by using the inverter. As such, impact of a power grid on the inverter may be determined, so that costs of detecting a grid connection of the inverter are reduced.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 1 is a schematic diagram of a power grid and an inverter that use a port model according to an embodiment of the present disclosure;

FIG. 2 is a flowchart of a method for detecting grid connection stability of an inverter according to another embodiment of the present disclosure;

DETAILED DESCRIPTION OF ILLUSTRATIVE EMBODIMENTS

Figure 3:
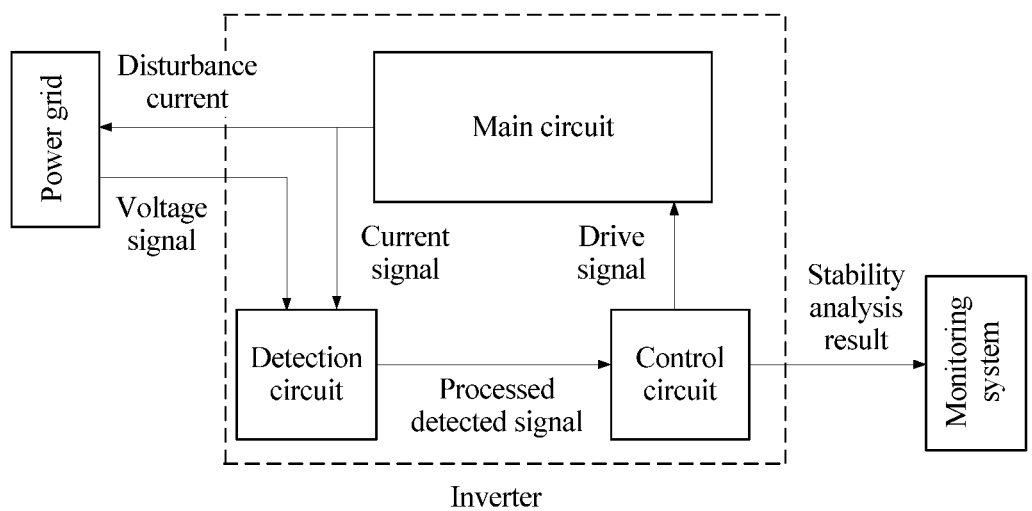
FIG. 3 shows a structure of an inverter according to another embodiment of the present disclosure.

The following describes the technical solutions in the embodiments of the present disclosure with reference to the accompanying drawings in the embodiments of the present disclosure. An inverter is an apparatus that converts direct current electric energy into alternating current electric energy. Inverters are widely applied to a modernized power system. A direct current port of the inverter may be connected to an external direct current power supply or an external load, and an alternating current port of the inverter may be connected to an alternating current power grid.

A stable operating status of the inverter refers to that the inverter can perform active or reactive power transfer with a specified quota on the power grid (or a microgrid). In an operating process, the operating status of the inverter is affected by an actual condition of the power grid. When the inverter is connected to a backbone network by using a long-distance electricity transmission line, or when the inverter is directly connected to a microgrid, equivalent impedance of the power grid cannot be ignored. The equivalent impedance affects voltage stability of the alternating current port of the inverter, and further affects the operating status of the inverter. When the equivalent impedance seriously affects the inverter, the inverter cannot operate stably. For example, voltage or current oscillation is caused, and shutdown of an inverter or a power supply system may even be caused by triggering protection. Therefore, before the inverter performs grid connected power transfer, analyzing impact of an actual condition of the power grid on an inverter operation may be necessary.

When the impact of the power grid on the inverter is being analyzed, a port network model is generally used to represent a feature of an alternating current port of the power grid and the inverter, as shown in FIG. 1. In FIG. 1, Vs is a voltage of a backbone network, Z is an equivalent impedance value of the power grid, Y is equivalent admittance of the inverter, is an output current of the inverter, and v is a voltage of the alternating current port of the inverter. The following formula may be obtained according to FIG. 1: $V=(VS+i_{inv}*Z)/(1+Z*Y)$.

The foregoing formula is an expression of the voltage of the alternating current port of the inverter. It may be seen from the foregoing formula that a denominator includes a product of the equivalent impedance value Z of the power grid and the equivalent admittance Y of the inverter. It may be learned according to a classical automatic control theory that the product of Z and Y is a dominant factor for the impact of the power grid on the inverter.

In conclusion, before an inverter enables a power transfer mode, a product of an equivalent impedance value Z of a power grid and an equivalent admittance value Y of the inverter needs to be analyzed. According to an analysis result, an actual impact of the power grid on an inverter operation may be predicted, avoiding voltage or current oscillation caused by inappropriate startup for operation. The power transfer mode refers to that the inverter converts direct current electric energy into alternating current electric energy that has a constant voltage and a constant frequency and feeds the alternating current electric energy to the power grid.

An embodiment of the present disclosure proposes a method for detecting grid connection stability of an inverter. FIG. 2 shows specific steps of an embodiment of the present disclosure. A direct current port of an inverter is connected to an external direct current power supply, and an alternating current port of the inverter is connected to a power grid. The method includes the following steps.

101. The inverter injects a first-sequence disturbance current into the power grid using the alternating current port of the inverter. While the first-sequence disturbance current is being injected into the power grid, the inverter detects a line voltage and a current of the alternating current port to obtain a first group of line voltage values ($v_{ab}^1$, $v_{bc}^1$, and $v_{ca}^1$) and a first group of current values ($i_a^1$, $i_b^1$, and $i_c^1$).

The first-sequence disturbance current includes currents in various forms, and the currents in the forms have different amplitudes. For example, the first-sequence disturbance current includes currents in two forms, and the currents in the two forms include a current whose amplitude is a and a current whose amplitude is b.

102. The inverter injects a second-sequence disturbance current into the power grid by using the alternating current port of the inverter. While the second-sequence disturbance current is being injected into the power grid, the inverter detects the line voltage and the current of the alternating current port to obtain a second group of line voltage values ($v_{ab}^2$, $v_{bc}^2$, and $v_{ca}^2$) and a second group of current values ($i_a^2$, $i_b^2$, and $i_c^2$), where the first-sequence disturbance current is different from the second-sequence disturbance current.

The second-sequence disturbance current includes currents in various forms, and the currents in the forms have different amplitudes.

The first-sequence disturbance current and the second-sequence disturbance current are nonlinearly correlated.

103. The inverter obtains an equivalent impedance matrix of the power grid according to the first group of line voltage values, the first group of current values, the second group of line voltage values, and the second group of current values.

104. The inverter determines, according to an equivalent admittance matrix of the inverter and the equivalent impedance matrix of the power grid, whether a stability requirement of the inverter is met.

It may be learned from the foregoing that according to the method for detecting grid connection stability of an inverter provided in this embodiment of the present disclosure, when an extra measurement apparatus or calculation apparatus does not need to be used, grid connection stability can be detected by using the inverter. Impact of a power grid on the inverter may be determined, so that costs of detecting a grid connection of the inverter are reduced.

Based on the foregoing embodiment, in another embodiment of the present disclosure, optionally, before the inverter injects the first-sequence disturbance current into the power grid using the alternating current port of the inverter, the method further includes: detecting, by the inverter, the line voltage of the alternating current port of the inverter to obtain a third group of line voltage values, where the third group of line voltage values includes three voltage values. When an amplitude of any value of the third group of line voltage values is less than a first threshold or a difference between any two amplitudes of the third group of line voltage values is less than a first threshold, the method further includes starting to inject, by the inverter, the first-sequence disturbance current into the power grid using the alternating current port of the inverter.

A typical value of the first threshold is 1% of a standard line voltage amplitude.

Based on the foregoing embodiment, in another embodiment of the present disclosure, optionally, after the starting to inject, by the inverter, the first-sequence disturbance current into the power grid by using the alternating current port of the inverter, the method further includes: detecting, by the inverter, the current of the alternating current port of the inverter to obtain a third group of current values, where the third group of current values includes three current values. When an amplitude of any value of the third group of current values is greater than a second threshold, the method also includes stopping injecting, by the inverter, the first-sequence disturbance current into the power grid.

Based on the foregoing embodiment, in another embodiment of the present disclosure, optionally, before the inverter injects the second-sequence disturbance current into the power grid using the alternating current port of the inverter, the method further includes: detecting, by the inverter, the line voltage of the alternating current port of the inverter to obtain a fourth group of line voltage values, where the fourth group of line voltage values includes three voltage values. When an amplitude of any value of the fourth group of line voltage values is less than a third threshold or a difference between any two amplitudes of the fourth group of line voltage values is less than a third threshold, the method also includes starting to inject, by the inverter, the second-sequence disturbance current into the power grid using the alternating current port of the inverter.

Based on the foregoing embodiment, in another embodiment of the present disclosure, optionally, after the starting to inject, by the inverter, the second-sequence disturbance current into the power grid by using the alternating current port of the inverter, the method further includes: detecting, by the inverter, the current of the alternating current port of the inverter to obtain a fourth group of current values, where the fourth group of current values includes three current values. When an amplitude of any value of the fourth group of current values is greater than a fourth threshold, the method includes stopping injecting, by the inverter, the second-sequence disturbance current into the power grid.

Based on the foregoing embodiment, in another embodiment of the present disclosure, optionally, that the inverter obtains an equivalent impedance matrix of the power grid according to the first group of line voltage values, the first group of current values, the second group of line voltage values, and the second group of current values includes: performing coordinate transformation and discrete Fourier transform on the first group of line voltage values ($v_{ab}^1$, $v_{bc}^1$, and $v_{ca}^1$) to obtain a first group of frequency-domain components ($v_d^1(j\omega)$ and $v_q^1(j\omega)$) of a voltage in a synchronous rotating coordinate system; performing coordinate transformation and discrete Fourier transform on the first group of current values ($i_a^1$, $i_b^1$, and $i_c^1$) to obtain a first group of frequency-domain components ($i_d^1(j\omega)$ and $i_q^1(j\omega)$) of a current in the synchronous rotating coordinate system; performing coordinate transformation and discrete Fourier transform on the second group of line voltage values ($v_{ab}^2$, $v_{bc}^2$, and $v_{ca}^2$) to obtain a second group of frequency-domain components ($v_d^2(j\omega)$ and $v_q^2(j\omega)$) of the voltage in the synchronous rotating coordinate system; performing coordinate transformation and discrete Fourier transform on the second group of current values ($i_a^2$, $i_b^2$, and $i_c^2$) to obtain a second group of frequency-domain components ($i_d^2(j\omega)$ and $i_q^2(j\omega)$) of the current in the synchronous rotating coordinate system; and calculating the equivalent impedance matrix Zdq(jω) of the power grid in the synchronous rotating coordinate system according to the first group of frequency-domain components of the voltage, the first group of frequency-domain components of the current, the second group of frequency-domain components of the voltage, the second group of frequency-domain components of the current, and the following formula:

$$Z_{dq}(j\omega) = \begin{vmatrix} v_d^1(j\omega) & v_d^2(j\omega) \\ v_q^1(j\omega) & v_q^2(j\omega) \end{vmatrix} \cdot \begin{vmatrix} i_d^1(j\omega) & i_d^2(j\omega) \\ i_q^1(j\omega) & i_q^2(j\omega) \end{vmatrix}^{-1}.$$

That the inverter determines, according to an equivalent admittance matrix of the inverter and the equivalent impedance matrix of the power grid, whether a stability requirement of the inverter is met includes: multiplying a matrix norm of Zdq(jω) by a matrix norm of the equivalent admittance matrix Ydq(jω) of the inverter to obtain a product, where Ydq(jω) is a parameter pre-stored in the inverter; determining a relationship between the product and a preset value, where the preset value may be a constant 1; and when the product is less than the preset value, determining that the inverter is capable of a stable grid-connected operation; or when the product is not less than the preset value, determining that the inverter is not capable of a stable grid-connected operation.

Based on the foregoing embodiment, in another embodiment of the present disclosure, optionally, the method further includes: when that the inverter is not capable of a stable grid-connected operation is determined, shutting down and sending, by the inverter, an alarm prompt to a monitoring system.

Based on the foregoing embodiment, in another embodiment of the present disclosure, optionally, the method further includes: when that the inverter is capable of a stable grid-connected operation is determined, ending, by the inverter, a self test process, and entering a power transfer working mode.

In another embodiment of the present disclosure, the present disclosure provides a method for determining grid connection stability of an inverter. It may be learned according to a formula V=(VS+i$_{inv}$*Z)/(1+Z*Y) that impact of a power grid on an inverter may be analyzed by using a product of equivalent impedance Z of the power grid and an equivalent admittance parameter Y of the inverter.

A product of an equivalent impedance matrix Zdq(jω) of the power grid and an equivalent admittance matrix Ydq(jω) of the inverter in a synchronous rotating coordinate system is defined as a system return-ratio matrix Ldq(jω). Before a grid-connected operation, both the power grid and the inverter can operate independently and stably. Therefore, there is no right half plane pole in either Zdq(jω) or Ydq(jω). According to a stability criterion of generalized Nyquist, when and only when an eigenvalue trace of Ldq(jω) does not bypass a point (−1, 0) clockwise in a complex plane, the inverter is capable of a stable grid-connected operation.

Because a process of calculating an eigenvalue of the matrix Ldq(jω) is complicated, a stability criterion based on the eigenvalue of the matrix Ldq(jω) is simplified according to a sufficient condition, and stability analysis and determining may be performed by using an obtained simplified formula. The simplified formula is as follows:

$\|Z_{dq}(j\omega)\|_{max} \cdot \|Y_{dq}(j\omega)\|_{sum} < 1$, where $\|Z_{dq}(j\omega)\|_{max}$ represents a maximum value of all element modulus values in the equivalent impedance matrix Zdq(jω) of the power grid, and the maximum value is also referred to as a maximum norm of the matrix Zdq(jω); $\|Y_{dq}(j\omega)\|_{sum}$ represents a sum of all element modulus values in the equivalent admittance matrix Ydq(jω) of the inverter, and the sum is also referred to as a sum norm of the equivalent admittance matrix Ydq(jω) of the inverter.

It may be learned according to a mathematical derivation that the simplified formula $\|Z_{dq}(j\omega)\|_{max} \cdot \|Y_{dq}(j\omega)\|_{sum} < 1$ is a sufficient condition for that the eigenvalue trace of Ldq(jω) does not bypass the point (−1, 0) clockwise in the complex plane. Therefore, in a system that meets the simplified formula, the power grid does not cause a serious negative impact on the inverter or cause the inverter not to operate stably. All systems that do not meet the simplified formula are considered as unstable systems.

It may be learned from the foregoing that, a stability criterion of generalized Nyquist is simplified in this embodiment of the present disclosure, and a calculation amount in a stability analysis process is reduced by using a sufficient condition of the stability criterion of the generalized Nyquist, so that an improved stability criterion can match a calculation capability of an inverter processor, and an inverter provided in an embodiment of the present disclosure has a stability analysis function.

FIG. 3 is a structure of an inverter in an embodiment of the present disclosure. The inverter in this embodiment includes parts such as a main circuit, a detection circuit, and a control circuit. Functions of the parts are as follows.

The main circuit is configured to implement energy transfer between a direct current side and an alternating current side, and in the present disclosure, is configured to inject a disturbance current into a power grid. The main circuit includes a direct current bus capacitor, a power electronic switching device, an alternating current side filter (such as an L-shaped filter or an LCL filter), a relay, and the like.

The detection circuit is configured to detect signals such as a voltage and a current of the inverter, is further configured to process a detected signal, and is further configured to send the processed detected signal to the control circuit. The detection circuit includes a sensor, a sampling circuit, and a modulation circuit.

The control circuit is configured to: substitute the detected signal from the detection circuit into a control algorithm for calculation and generate a drive signal according to a calculation result. The control circuit is further configured to send the drive signal to the power electronic switching device in the main circuit. The control circuit is further configured to record detected signal data and calculate equivalent impedance of the power grid. The control circuit is further configured to analyze a stability status in which the inverter performs a grid-connected operation. The control circuit is further configured to output a stability analysis result to an external monitoring system. The control circuit includes a drive circuit, a digital signal processor, and the like. Common digital signal processors include a DSP (Digital Signal Processor) and an FPGA (Field Programmable Gate Array).

In another embodiment of the present disclosure, power grid impedance and an inverter admittance parameter need to be obtained to analyze grid connection stability of the inverter. The inverter admittance parameter is related to the inverter, and the inverter admittance parameter can be obtained directly. However, the power grid impedance needs to be measured.

A method of injecting a discrete disturbance current is used in an embodiment of the present disclosure, so as to avoid an unstable phenomenon generated in a power grid and caused by continuously injecting a disturbance current.

In a complete process of injecting a disturbance current, an inverter sequentially experiences three working modes.

Figure 4:
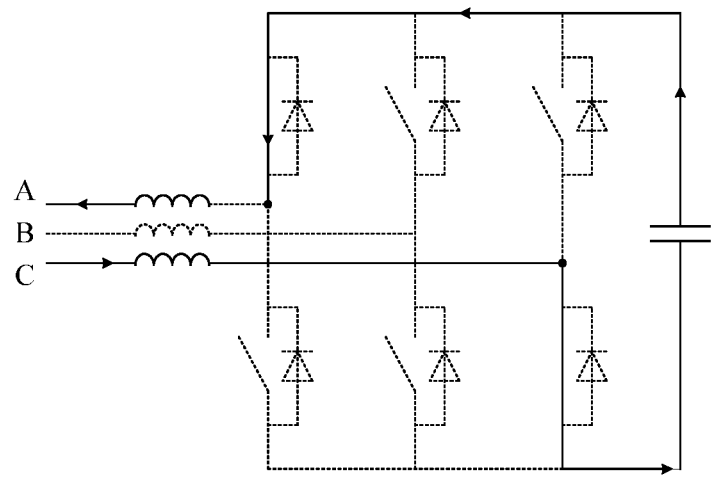
FIG. 4 is a schematic diagram of a discharge mode of an inverter according to another embodiment of the present disclosure.

FIG. 4 shows a discharge mode. A detection circuit detects a line voltage of an alternating current port of the inverter. When a difference between any two line voltage amplitudes is less than a specified threshold ε (a typical value is 1% of a standard line voltage amplitude) or any line voltage amplitude is less than a specified threshold ε, a control circuit sends an activation drive signal to a power electronic switching device in a main circuit, so that the inverter releases energy to the power grid and a current of the alternating current port of the inverter increases constantly.

Figure 5:
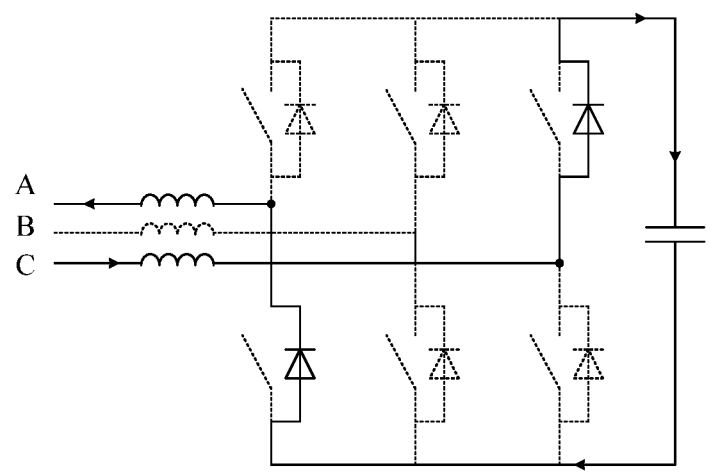
FIG. 5 is a schematic diagram of a freewheeling mode of an inverter according to another embodiment of the present disclosure.

FIG. 5 shows a freewheeling mode. The detection circuit detects the current of the alternating current port of the inverter. When a current amplitude reaches a specified current protection value $i_{limit}$, the control circuit sends a shutdown drive signal to the power electronic switching device in the main circuit. In this case, in a filter of the main circuit, freewheeling is performed on residual energy by using a diode in the main circuit, until a freewheeling current is reduced to zero.

Figure 6:
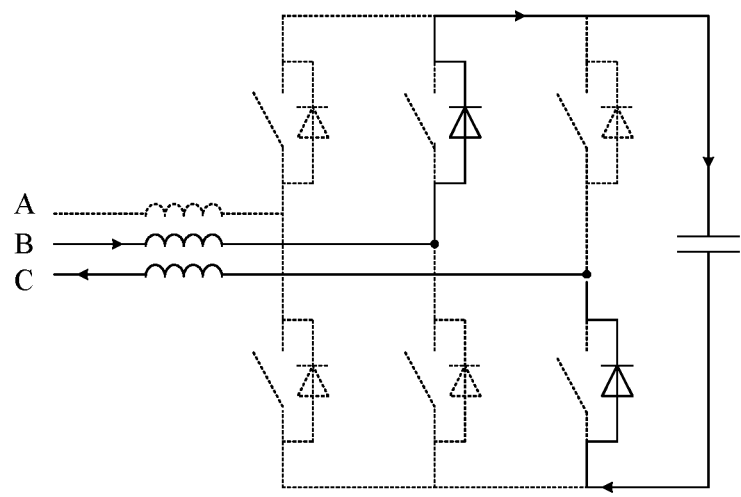
FIG. 6 is a schematic diagram of an uncontrolled charge mode of an inverter according to another embodiment of the present disclosure.

FIG. 6 shows an uncontrolled charge mode. When a line voltage on an alternating current side is higher than a voltage of a direct current bus capacitor, the control circuit does not send the activation drive signal to the power electronic switching device in the main circuit, and a current of the filter of the main circuit is zero, the diode in the main circuit is automatically conducted, and the power grid charges the direct current bus capacitor of the inverter until a charging current is reduced to zero.

As shown in FIG. 4 to FIG. 6, in another embodiment of the present disclosure, all switching devices between the alternating current port of the inverter and a positive electrode of the direct current bus capacitor are defined as upper bridge arm switches, and all switching devices between the alternating current port and a negative electrode of the direct current bus capacitor are lower bridge arm switches. For example, in a two-level inverter, when (vAB−vBC)<ε, the control circuit sends the activation drive signal to an upper bridge arm switch of a phase A and a lower bridge arm switch of a phase C, and the main circuit works in the discharge mode by using the phase A and the phase C. When the current amplitude increases and reaches the specified current protection value $i_{limit}$, the main circuit works in the freewheeling mode by using the phase A and the phase C. When the line voltage vBC is higher than the voltage of the direct current bus capacitor, the main circuit works in the uncontrolled charge mode by using a phase B and the phase C.

In another embodiment of the present disclosure, two linearly independent disturbance current sequences are generated by periodically adjusting the current protection value ihmit of the alternating current port of the inverter, and are sequentially injected into the power grid. Each sequence involves multiple processes of injecting a disturbance current.

Figure 7:
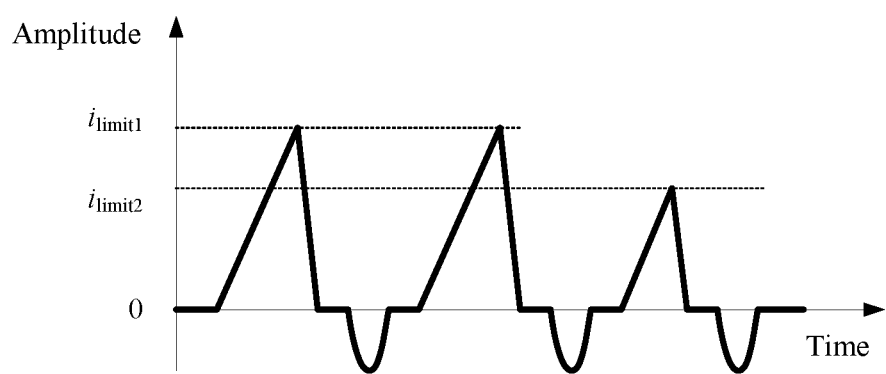
FIG. 7 shows a first-sequence disturbance current according to another embodiment of the present disclosure.
Figure 8:
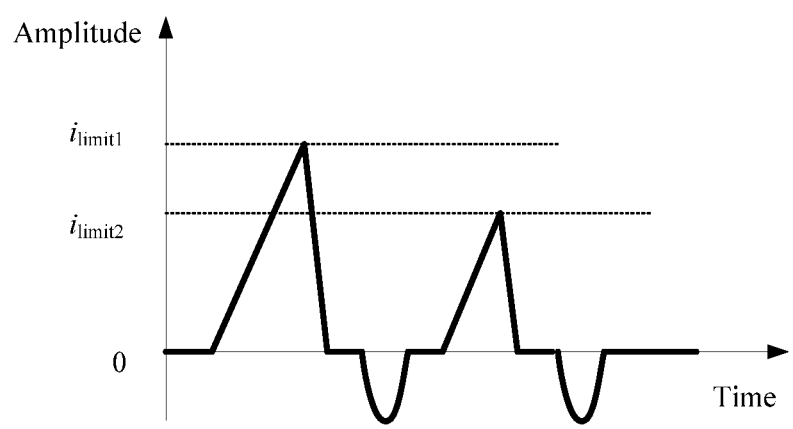
FIG. 8 shows a second-sequence disturbance current according to another embodiment of the present disclosure.

For example, two different current protection values of the alternating current port are respectively set to $i_{limit1}$ and $i_{limit2}$, where $i_{limit1}$ is greater than $i_{limit2}$. In a first-sequence disturbance current, three times of disturbance current injection are used as one period. A limited amplitude of the first and the second current injection is ilimit1, and a limited amplitude of the third current injection is $i_{limit2}$. In a second-sequence disturbance current, two times of disturbance current injection are used as one period. A limited amplitude of the first current injection is ilimit1, and a limited amplitude of the second current injection is $i_{limit2}$. Schematic diagrams of the two linearly independent disturbance current sequences are shown in FIG. 7 and FIG. 8.

Figure 9:
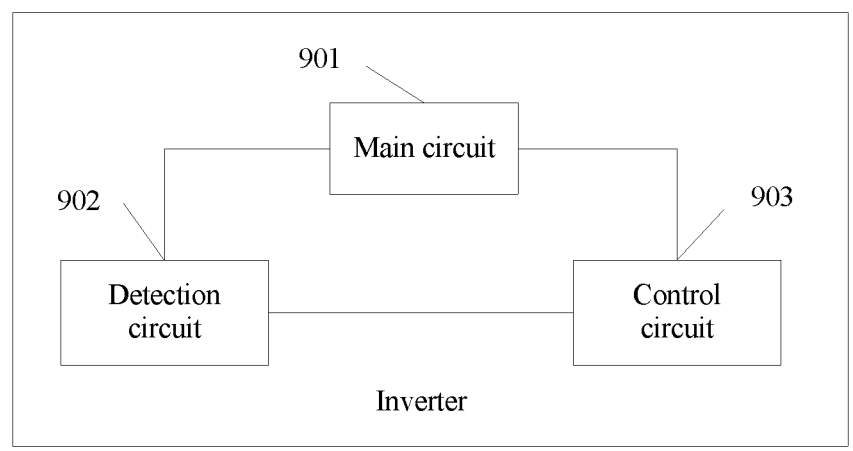
FIG. 9 is a structural diagram of an inverter according to another embodiment of the present disclosure.

As shown in FIG. 9, an embodiment of the present disclosure provides an inverter. A direct current port of the inverter is connected to an external direct current power supply, an alternating current port of the inverter is connected to a power grid, and the inverter includes a main circuit 901, a detection circuit 902, and a control circuit 903.

The main circuit 901 is configured to inject a first-sequence disturbance current into the power grid by using the alternating current port of the inverter.

The detection circuit 902 is configured to: while the main circuit 901 injects the first-sequence disturbance current into the power grid, detect a line voltage and a current of the alternating current port to obtain a first group of line voltage values ($v_{ab}^1$, $v_{bc}^1$, and $v_{ca}^1$) and a first group of current values ($i_a^1$, $v_b^1$, and $i_c^1$).

The main circuit 901 is further configured to inject a second-sequence disturbance current into the power grid by using the alternating current port of the inverter.

The main circuit includes a direct current bus capacitor, a power electronic switching device, an alternating current side filter (such as an L-shaped filter or an LCL filter), a relay, and the like.

The detection circuit 902 is further configured to: while the main circuit 901 injects the second-sequence disturbance current into the power grid, detect the line voltage and the current of the alternating current port to obtain a second group of line voltage values ($v_{ab}^2$, $v_{bc}^2$, and $v_{ca}^2$) and a second group of current values ($i_a^2$, $i_b^2$, and $i_c^2$), where the first-sequence disturbance current is different from the second-sequence disturbance current. The detection circuit includes a sensor, a sampling circuit, and a modulation circuit.

The control circuit 903 is configured to obtain an equivalent impedance matrix of the power grid according to the first group of line voltage values, the first group of current values, the second group of line voltage values, and the second group of current values.

The control circuit 903 is further configured to determine, according to an equivalent admittance matrix of the inverter and the equivalent impedance matrix of the power grid, whether a stability requirement of the inverter is met.

The control circuit includes a drive circuit, a digital signal processor, and the like. Common digital signal processors include a DSP, an FPGA, and the like.

It may be learned from the foregoing that according to the inverter provided in this embodiment of the present disclosure, when an extra measurement apparatus or calculation apparatus does not need to be used, grid connection stability can be detected by using the inverter. Impact of a power grid on the inverter may be determined, so that costs of detecting a grid connection of the inverter are reduced.

Optionally, based on the foregoing inverter, in another embodiment of the present disclosure, the detection circuit 902 is further configured to detect the line voltage of the alternating current port of the inverter to obtain a third group of line voltage values; and the control circuit 903 is configured to: when an amplitude of any value of the third group of line voltage values is less than a first threshold or a difference between any two amplitudes of the third group of line voltage values is less than a first threshold, control the main circuit 901 to start to inject the first-sequence disturbance current into the power grid by using the alternating current port of the inverter.

The control circuit 903 sends an activation signal to the power electronic switching device in the main circuit 901, so that the power electronic switching device is in an activated state, and the first-sequence disturbance current can enter the power grid by using the power electronic switching device.

Optionally, based on the foregoing inverter, in another embodiment of the present disclosure, the detection circuit 902 is further configured to detect the current of the alternating current port of the inverter to obtain a third group of current values. The control circuit 903 is further configured to: when an amplitude of any value of the third group of current values is greater than a second threshold, control the main circuit 901 to stop injecting the first-sequence disturbance current into the power grid.

The control circuit 903 sends a shutdown signal to the power electronic switching device in the main circuit 901, so that the power electronic switching device is in a disconnected state, and the first-sequence disturbance current stops being injected into the power grid.

Optionally, based on the foregoing inverter, in another embodiment of the present disclosure, the detection circuit 902 is further configured to detect the line voltage of the alternating current port of the inverter to obtain a fourth group of line voltage values. The control circuit 903 is further configured to, when an amplitude of any value of the fourth group of line voltage values is less than a third threshold or a difference between any two amplitudes of the fourth group of line voltage values is less than a third threshold, control the main circuit 901 to start to inject the second-sequence disturbance current into the power grid by using the alternating current port of the inverter.

The control circuit 903 sends an activation signal to the power electronic switching device in the main circuit 901, so that the power electronic switching device is in an activated state, and the second-sequence disturbance current can enter the power grid by using the power electronic switching device.

Optionally, based on the foregoing inverter, in another embodiment of the present disclosure, the detection circuit 902 is further configured to detect the current of the alternating current port of the inverter to obtain a fourth group of current values. The control circuit 903 is further configured to, when an amplitude of any value of the fourth group of current values is greater than a fourth threshold, control the main circuit 901 to stop injecting the second-sequence disturbance current into the power grid.

The control circuit 903 sends a shutdown signal to the power electronic switching device in the main circuit 901, so that the power electronic switching device is in a disconnected state, and the second-sequence disturbance current stops being injected into the power grid.

Optionally, based on the foregoing inverter, in another embodiment of the present disclosure, the control circuit 903 is configured to perform coordinate transformation and discrete Fourier transform on the first group of line voltage values ($v_{ab}^1$, $v_{bc}^1$, and $v_{ca}^1$) to obtain a first group of frequency-domain components ($v_d^1(j\omega)$ and $v_q^1(j\omega)$) of a voltage in a synchronous rotating coordinate system. The control circuit 903 is configured to perform coordinate transformation and discrete Fourier transform on the first group of current values ($i_a^1$, $i_b^1$, and $i_c^1$) to obtain a first group of frequency-domain components ($i_d^1(j\omega)$ and $i_q^1(j\omega)$) of a current in the synchronous rotating coordinate system. The control circuit 903 is configured to perform coordinate transformation and discrete Fourier transform on the second group of line voltage values ($v_{ab}^2$, $v_{bc}^2$, and $v_{ca}^1$) to obtain a second group of frequency-domain components ($v_d^2(j\omega)$ and $v_q^2(j\omega)$) of the voltage in the synchronous rotating coordinate system; the control circuit 903 is configured to perform coordinate transformation and discrete Fourier transform on the second group of current values ($i_a^2$, $i_b^2$, and $i_c^2$) to obtain a second group of frequency-domain components ($i_d^2(j\omega)$ and $i_q^2(j\omega)$) of the current in the synchronous rotating coordinate system. The control circuit 903 is configured to calculate the equivalent impedance matrix $Zdq(j\omega)$ of the power grid in the synchronous rotating coordinate system according to the first group of frequency-domain components of the voltage, the first group of frequency-domain components of the current, the second group of frequency-domain components of the voltage, the second group of frequency-domain components of the current, and the following formula:

$$Z_{dq}(j\omega) = \begin{vmatrix} v_d^1(j\omega) & v_d^2(j\omega) \\ v_q^1(j\omega) & v_q^2(j\omega) \end{vmatrix} \cdot \begin{vmatrix} i_d^1(j\omega) & i_d^2(j\omega) \\ i_q^1(j\omega) & i_q^2(j\omega) \end{vmatrix}^{-1}.$$

The control circuit 903 is configured to multiply a matrix norm of $Zdq(j\omega)$ by a matrix norm of the equivalent admittance matrix $Ydq(j\omega)$ of the inverter to obtain a product, where $Ydq(j\omega)$ is a parameter pre-stored in the inverter. The control circuit 903 is configured to determine a relationship between the product and a preset value, where the preset value may be 1; and the control circuit 903 is configured to: when the product is less than the preset value, determine that the inverter is capable of a stable grid-connected operation. The control circuit 903 is also configured to, when the product is not less than the preset value, determine that the inverter is not capable of a stable grid-connected operation.

Optionally, based on the foregoing inverter, in another embodiment of the present disclosure, the control circuit 903 is further configured to: when that the inverter is not capable of a stable grid-connected operation is determined, control the inverter to shut down and to send an alarm prompt to a monitoring system.

Optionally, based on the foregoing inverter, in another embodiment of the present disclosure, the control circuit 903 is further configured to: when that the inverter is capable of a stable grid-connected operation is determined, end a self test process, and control the inverter to enter a power transfer working mode.

It should be noted that, to make the description brief, the foregoing method embodiments are expressed as a series of actions. However, a person skilled in the art should appreciate that the present disclosure is not limited to the described action sequence, because according to the present disclosure, some steps may be performed in other sequences or performed simultaneously. In addition, a person skilled in the art should also appreciate that all the embodiments described in the specification are exemplary embodiments, and the related actions and modules are not necessarily mandatory to the present disclosure.

Content such as information exchange and an execution process between the modules in the apparatus and the system is based on a same idea as the method embodiments of the present disclosure. Therefore, for detailed content, refer to descriptions in the method embodiments of the present disclosure, and details are not described herein again.

Specific examples are used in this specification to describe the principle and implementation manners of the present disclosure. The descriptions of the foregoing embodiments are merely intended to help understand the method and idea of the present disclosure. In addition, with respect to the implementation manners and the application scope, modifications may be made by a person of ordinary skill in the art according to the idea of the present disclosure. Therefore, this specification shall not be construed as a limitation on the present disclosure.

What is claimed is:

1. A method, comprising:
injecting, by an inverter, a first-sequence disturbance current into a power grid, wherein the first-sequence disturbance current is injected into the power grid using an alternating current port of the inverter, wherein a direct current port of the inverter is connected to an external direct current power supply, and the alternating current port of the inverter is connected to the power grid;
while the first-sequence disturbance current is being injected into the power grid, detecting, by the inverter, a line voltage and a current of the alternating current port to obtain a first group of line voltage values ($v_{ab}^1$, $v_{bc}^1$, $v_{ca}^1$) and a first group of current values ($i_a^1$, $i_b^1$, $i_c^1$);
injecting, by the inverter, a second-sequence disturbance current into the power grid using the alternating current port of the inverter; and
while the second-sequence disturbance current is being injected into the power grid, detecting, by the inverter, the line voltage and the current of the alternating current port to obtain a second group of line voltage values ($v_{ab}^2$, $v_{bc}^2$, $v_{ca}^2$) and a second group of current values ($i_1^2$, $i_b^2$, $i_c^2$), wherein the first-sequence disturbance current is different from the second-sequence disturbance current;
obtaining, by the inverter, an equivalent impedance matrix of the power grid according to the first group of line voltage values, the first group of current values, the second group of line voltage values, and the second group of current values; and
determining, by the inverter according to an equivalent admittance matrix of the inverter and the equivalent impedance matrix of the power grid, whether a stability requirement of the inverter is met.

2. The method according to claim 1, wherein before injecting the first-sequence disturbance current into the power grid, the method further comprises:
detecting, by the inverter, the line voltage of the alternating current port of the inverter to obtain a third group of line voltage values; and
when an amplitude of any value of the third group of line voltage values is less than a first threshold, or when a difference between any two amplitudes of the third group of line voltage values is less than the first threshold, starting to inject, by the inverter, the first-sequence disturbance current into the power grid using the alternating current port of the inverter.

3. The method according to claim 2, wherein after starting to inject the first-sequence disturbance current into the power grid, the method further comprises:
detecting, by the inverter, the current of the alternating current port of the inverter to obtain a third group of current values; and
when an amplitude of any value of the third group of current values is greater than a second threshold, stopping injecting, by the inverter, the first-sequence disturbance current into the power grid.

4. The method according to claim 1, wherein before injecting the second-sequence disturbance current into the power grid, the method further comprises:
detecting, by the inverter, the line voltage of the alternating current port of the inverter to obtain a fourth group of line voltage values; and
when an amplitude of any value of the fourth group of line voltage values is less than a third threshold, or when a difference between any two amplitudes of the fourth group of line voltage values is less than a third threshold, starting to inject, by the inverter, the second-sequence disturbance current into the power grid using the alternating current port of the inverter.

5. The method according to claim 4, wherein after the starting to inject the second-sequence disturbance current into the power grid, the method further comprises:
detecting, by the inverter, the current of the alternating current port of the inverter to obtain a fourth group of current values; and
when an amplitude of any value of the fourth group of current values is greater than a fourth threshold, stopping injecting, by the inverter, the second-sequence disturbance current into the power grid.

6. The method according to claim 1, wherein obtaining the equivalent impedance matrix of the power grid according to the first group of line voltage values, the first group of current values, the second group of line voltage values, and the second group of current values comprises:
performing coordinate transformation and discrete Fourier transform on the first group of line voltage values ($v_{ab}^1$, $v_{bc}^1$, $v_{ca}^1$) to obtain a first group of frequency-domain components ($v_d^1(j\omega)$, $v_q^1(j\omega)$) of a voltage in a synchronous rotating coordinate system;
performing coordinate transformation and discrete Fourier transform on the first group of current values ($i_a^1$, $i_b^1$, $i_c^1$) to obtain a first group of frequency-domain components ($i_d^1(j\omega)$, $i_q^1(j\omega)$) of a current in the synchronous rotating coordinate system;
performing coordinate transformation and discrete Fourier transform on the second group of line voltage values ($v_{ab}^2$, $v_{bc}^2$, $v_{ca}^2$) to obtain a second group of frequency-domain components ($v_d^2(j\omega)$, $v_q^2(j\omega)$) of the voltage in the synchronous rotating coordinate system;
performing coordinate transformation and discrete Fourier transform on the second group of current values ($i_a^2$, $i_b^2$, $i_c^2$) to obtain a second group of frequency-domain components ($i_d^2(j\omega)$, $i_q^2(j\omega)$) of the current in the synchronous rotating coordinate system; and
calculating the equivalent impedance matrix $Zdq(j\omega)$ of the power grid in the synchronous rotating coordinate system according to the first group of frequency-domain components of the voltage, the first group of frequency-domain components of the current, the second group of frequency-domain components of the voltage, the second group of frequency-domain components of the current, and the following relation:

$$Z_{dq}(j\omega) = \begin{vmatrix} v_d^1(j\omega) & v_d^2(j\omega) \\ v_q^1(j\omega) & v_q^2(j\omega) \end{vmatrix} \cdot \begin{vmatrix} i_d^1(j\omega) & i_d^2(j\omega) \\ i_q^1(j\omega) & i_q^2(j\omega) \end{vmatrix}^{-1};$$

and
wherein determining whether the stability requirement of the inverter is met comprises:

multiplying a matrix norm of Zdq(jω) by a matrix norm of the equivalent admittance matrix Ydq(jω) of the inverter to obtain a product, wherein Ydq(jω) is a parameter pre-stored in the inverter;

determining a relationship between the product and a preset value;

when the product is less than the preset value, determining that the inverter is capable of a stable grid-connected operation; and when the product is not less than the preset value, determining that the inverter is not capable of a stable grid-connected operation.

7. The method according to claim 1, further comprising:
when it is determined that the inverter is not capable of a stable grid-connected operation, shutting down, by the inverter, and sending, by the inverter, an alarm prompt to a monitoring system.

8. The method according to claim 1, further comprising:
when it is determined that the inverter is capable of a stable grid-connected operation, ending, by the inverter, a self test process, and entering a power transfer working mode.

9. An inverter, comprising:
a main circuit;
a detection circuit; and
a control circuit;
wherein a direct current port of the inverter is connected to an external direct current power supply, an alternating current port of the inverter is connected to a power grid;
wherein the main circuit is configured to inject a first-sequence disturbance current into the power grid using the alternating current port of the inverter;
wherein the detection circuit is configured to, while the main circuit injects the first-sequence disturbance current into the power grid, detect a line voltage and a current of the alternating current port to obtain a first group of line voltage values ($v_{ab}^1$, $v_{bc}^1$, $v_{ca}^1$) and a first group of current values ($i_a^1$, $i_b^1$, d $i_c^1$);
wherein the main circuit is further configured to inject a second-sequence disturbance current into the power grid using the alternating current port of the inverter;
wherein the detection circuit is further configured to, while the main circuit injects the second-sequence disturbance current into the power grid, detect the line voltage and the current of the alternating current port to obtain a second group of line voltage values ($v_{ab}^2$, $v_{bc}^2$, $v_{ca}^2$) and a second group of current values ($i_a^2$, $i_b^2$ and $i_c^2$), wherein the first-sequence disturbance current is different from the second-sequence disturbance current;
wherein the control circuit is configured to obtain an equivalent impedance matrix of the power grid according to the first group of line voltage values, the first group of current values, the second group of line voltage values, and the second group of current values; and
wherein the control circuit is further configured to determine, according to an equivalent admittance matrix of the inverter and the equivalent impedance matrix of the power grid, whether a stability requirement of the inverter is met.

10. The inverter according to claim 9, wherein the detection circuit is further configured to detect the line voltage of the alternating current port of the inverter to obtain a third group of line voltage values; and wherein the control circuit is further configured to, when an amplitude of any value of the third group of line voltage values is less than a first threshold, or when a difference between any two amplitudes of the third group of line voltage values is less than a first threshold, control the main circuit to start to inject the first-sequence disturbance current into the power grid using the alternating current port of the inverter.

11. The inverter according to claim 10, wherein the detection circuit is further configured to detect the current of the alternating current port of the inverter to obtain a third group of current values; and wherein the control circuit is further configured to, when an amplitude of any value of the third group of current values is greater than a second threshold, control the main circuit to stop injecting the first-sequence disturbance current into the power grid.

12. The inverter according to claim 9, wherein the detection circuit is further configured to detect the line voltage of the alternating current port of the inverter to obtain a fourth group of line voltage values; and wherein the control circuit is further configured to, when an amplitude of any value of the fourth group of line voltage values is less than a third threshold, or when a difference between any two amplitudes of the fourth group of line voltage values is less than a third threshold, control the main circuit to start to inject the second-sequence disturbance current into the power grid using the alternating current port of the inverter.

13. The inverter according to claim 12, wherein the detection circuit is further configured to detect the current of the alternating current port of the inverter to obtain a fourth group of current values; and wherein the control circuit is further configured to, when an amplitude of any value of the fourth group of current values is greater than a fourth threshold, control the main circuit to stop injecting the second-sequence disturbance current into the power grid.

14. The inverter according to claim 9, wherein the control circuit is configured to:
perform coordinate transformation and discrete Fourier transform on the first group of line voltage values ($v_{ab}^1$, $v_{bc}^1$, $v_{ca}^1$) to obtain a first group of frequency-domain components ($v_d^1(j\omega)$, $v_q^1(j\omega)$) of a voltage in a synchronous rotating coordinate system;

perform coordinate transformation and discrete Fourier transform on the first group of current values ($i_a^1$, $i_b^1$, $i_c^1$) to obtain a first group of frequency-domain components ($i_d^1(j\omega)$, $i_q^1(j\omega)$) of a current in the synchronous rotating coordinate system;

perform coordinate transformation and discrete Fourier transform on the second group of line voltage values ($v_{ab}^2$, $v_{bc}^2$, $v_{ca}^2$) to obtain a second group of frequency-domain components ($v_d^2(j\omega)$, $v_q^2(j\omega)$) of the voltage in the synchronous rotating coordinate system;

perform coordinate transformation and discrete Fourier transform on the second group of current values ($i_a^2$, $i_b^2$, $i_c^2$) to obtain a second group of frequency-domain components ($i_d^2(j\omega)$, $i_q^2(j\omega)$) of the current in the synchronous rotating coordinate system;

calculate the equivalent impedance matrix Zdq(jω) of the power grid in the synchronous rotating coordinate system according to the first group of frequency-domain components of the voltage, the first group of frequency-domain components of the current, the second group of frequency-domain components of the voltage, the second group of frequency-domain components of the current, and the following relation:

$$Z_{dq}(j\omega) = \begin{vmatrix} v_d^1(j\omega) & v_d^2(j\omega) \\ v_q^1(j\omega) & v_q^2(j\omega) \end{vmatrix} \cdot \begin{vmatrix} i_d^1(j\omega) & i_d^2(j\omega) \\ i_q^1(j\omega) & i_q^2(j\omega) \end{vmatrix}^{-1};$$

multiply a matrix norm of Zdq(jω) by a matrix norm of the equivalent admittance matrix Ydq(jω) of the inverter to obtain a product, wherein Ydq(jω) is a parameter pre-stored in the inverter;

determine a relationship between the product and a preset value;

when the product is less than the preset value, determine that the inverter is capable of a stable grid-connected operation; and when the product is not less than the preset value, determine that the inverter is not capable of a stable grid-connected operation.

15. The inverter according to claim 9, wherein the control circuit is further configured to: when it is determined that the inverter is not capable of a stable grid-connected operation, control the inverter to shut down and to send an alarm prompt to a monitoring system.

16. The inverter according to claim 9, wherein the control circuit is further configured to: when it is determined that the inverter is capable of a stable grid-connected operation, end a self test process, and control the inverter to enter a power transfer working mode.

17. An inverter, comprising:
a main circuit;
a detection circuit; and
a control circuit;
wherein a direct current port of the inverter is connected to an external direct current power supply, an alternating current port of the inverter is connected to a power grid;
wherein the main circuit is configured to inject a first-sequence disturbance current into the power grid using the alternating current port of the inverter, wherein injecting the first-sequence disturbance current into the power grid comprises the inverter sequentially experiencing a first mode, a second mode, and a third mode;

wherein the detection circuit is configured to, while the main circuit injects the first-sequence disturbance current into the power grid, detect a line voltage and a current of the alternating current port to obtain a first group of line voltage values ($v_{ab}^1$, $v_{bc}^1$, $v_{ca}^1$) and a first group of current values ($i_a^1$, $i_b^1$, d $i_c^1$);

wherein the main circuit is further configured to inject a second-sequence disturbance current into the power grid using the alternating current port of the inverter, wherein injecting the second-sequence disturbance current into the power grid comprises the inverter sequentially experiencing the first mode, the second mode, and the third mode;

wherein the detection circuit is further configured to: while the main circuit injects the second-sequence disturbance current into the power grid, detect the line voltage and the current of the alternating current port to obtain a second group of line voltage values ($v_{ab}^2$, $v_{bc}^2$, $v_{ca}^2$) and a second group of current values ($i_a^2$, $i_b^2$, and $i_c^2$), wherein the first-sequence disturbance current is different from the second-sequence disturbance current;

wherein the control circuit is configured to obtain an equivalent impedance matrix of the power grid according to the first group of line voltage values, the first group of current values, the second group of line voltage values, and the second group of current values; and wherein the control circuit is further configured to determine, according to an equivalent admittance matrix of the inverter and the equivalent impedance matrix of the power grid, whether a stability requirement of the inverter is met.

18. The inverter according to claim 17, wherein the first mode is a discharge mode, and wherein the inverter releases energy to the power grid during the discharge mode.

19. The inverter according to claim 17, wherein the second mode is a freewheeling mode, and wherein the inverter reduces a freewheeling current to zero during the freewheeling mode.

20. The inverter according to claim 17, wherein the third mode is an uncontrolled charge mode, and wherein in the uncontrolled charge mode the power grid charges a capacitor of the inverter until a charging current is reduced to zero.

* * * * *